United States Patent
Rizzo et al.

(10) Patent No.: US 7,215,723 B2
(45) Date of Patent: May 8, 2007

(54) DEMODULATOR FOR AN AMPLITUDE-MODULATED ALTERNATING SIGNAL

(75) Inventors: Pierre Rizzo, Aubagne (FR); Francis Dell'Ova, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 945 days.

(21) Appl. No.: 10/239,291

(22) PCT Filed: Mar. 20, 2001

(86) PCT No.: PCT/FR01/00832

§ 371 (c)(1),
(2), (4) Date: Nov. 6, 2002

(87) PCT Pub. No.: WO01/71997

PCT Pub. Date: Sep. 27, 2001

(65) Prior Publication Data

US 2003/0128070 A1    Jul. 10, 2003

(30) Foreign Application Priority Data

Mar. 21, 2000   (FR)   .................................. 00 03606

(51) Int. Cl.
H04L 27/00   (2006.01)

(52) U.S. Cl. ...................................... 375/324; 329/347
(58) Field of Classification Search ................ 375/324, 375/316, 317; 327/58–62; 329/347, 350
See application file for complete search history.

(56) References Cited

U.S. PATENT DOCUMENTS

| | | | | | |
|---|---|---|---|---|---|
| 4,914,398 | A | * | 4/1990 | Jove et al. | 361/111 |
| 5,025,251 | A | * | 6/1991 | Mittel et al. | 340/7.38 |
| 6,051,997 | A | * | 4/2000 | Yeung et al. | 327/58 |
| 6,393,069 | B1 | * | 5/2002 | Shibata | 375/340 |

* cited by examiner

*Primary Examiner*—Khanh Tran
(74) *Attorney, Agent, or Firm*—Lisa K. Jorgenson; Allen, Dyer, Doppelt, Milbrath & Gilchrist, P.A.

(57) ABSTRACT

The invention concerns a demodulator of an amplitude-modulated signal (Vdb), characterised in that it comprises a peak detecting cell (DCR) capable of extracting the reference modulating signal (Vpeak1) of the modulated signal (Vdb); a first demodulator (FE) adapted to detect the peak of the reference modulating signal (Vpeak1) to generate a high comparison threshold and locate the start of the modulation, a second demodulator (RE) adapted to detect a trough of the reference modulating signal (Vpeak1) to generate a low comparison threshold and locate the end of the modulation; a logic processing unit capable of supplying the demodulated signal (Vdemod).

33 Claims, 5 Drawing Sheets

DEMODULATOR FOR AN AMPLITUDE-MODULATED ALTERNATING SIGNAL

FIELD OF THE INVENTION

The present invention relates to a demodulator for an amplitude modulated alternating signal based on the peak and trough detection principle. The invention also relates to a contactless device comprising such a demodulator.

The demodulator according to the invention has a particularly advantageous application in the field of long range radio frequency (RF) communication.

BACKGROUND OF THE INVENTION

Contactless communication portable devices such as contactless IC (integrated circuit) cards (also known as chip cards or smart cards), electronic labels or tags, or badges, operate on the basis of a communication by an electromagnetic field with a read and/or write interrogating device, generically referred to as a reader. Such contactless devices generally comprise a microcircuit connected to a parallel LC type resonant circuit. The inductor is an external antenna, while the capacitor is integrated to the microcircuit. The two form what is commonly known as a "tuned circuit".

As an example, in some contactless IC card applications, the reader transmits an electromagnetic signal having a carrier frequency of 13.56 MHz.

This transmitted signal serves on the one hand to power the contactless card, which thus derives by induction the energy required for its operation, and on the other hand to set up a communication between the card and the reader according to an established protocol. Thus, when the contactless card penetrates into the transmission field of the reader, it communicates with the latter by a modulation operation which consists in modifying at least one parameter of the carrier.

The contactless device receives, via its tuned circuit, an amplitude modulated signal from the reader. The contactless device interprets the message from the reader by a demodulation operation which consists in extracting the modulated signal from the carrier. The frequency of the modulated signal is much smaller than that of the carrier, in general around ten kHz.

The quality and reliability of the RF communication are directly linked, among things, to the distance between the reader and the contactless device. The distance, or range, of the RF communication between the reader and the contactless device depends on several parameters including the tuning frequency between the resonant circuit of the contactless device and the transmission frequency of the reader, as well as the quality of demodulation of the modulated signal.

The quality of demodulation of the modulated signal depends directly on the distance between the contactless device and the reader, as well as the speed of displacement of the device in the transmission field of the reader. The greater is the range, and the more the device is stealthy, the more the demodulation shall be subject to error.

Figure 1:
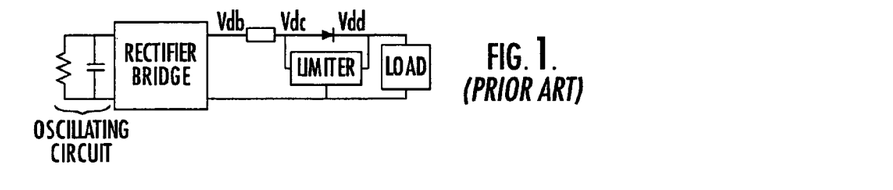
FIG. 1, already described, is a block diagram of the input stages of the contactless device.

FIG. 1 is a block diagram of the input stages of the contactless device. A resonant circuit, centered at the carrier frequency, receives a modulated electromagnetic signal. A rectifier bridge generates a dc voltage in order to power the contactless device. The output voltage Vdb of the rectifier bridge represents the dc voltage after rectification and contains both the energy needed for self-powering the contactless device and the information of the modulated signal.

For applications that use 100% amplitude modulation, a diode isolates the resonant circuit from the load and thus eliminates all possibility of a return current to the resonant circuit. A limiter allows to maintain the power supply voltage Vdd below a threshold, e.g. of 4V. A resistor is advantageously placed between Vdb and the diode so as to isolate the modulated signal on Vdb. Thus, the demodulation of the modulated signal coming from the reader is performed directly from the signal Vdb at the output of contactless device's rectifier bridge.

Figure 2:
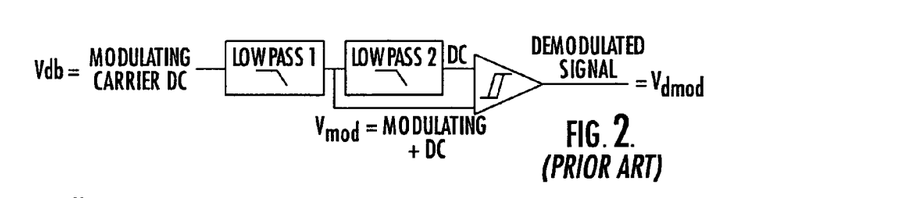
FIG. 2, already described, is a classical functional diagram for the demodulation of a signal.

FIG. 2 is a schematic illustration of a classical amplitude demodulation device.

The signal Vdb is first of all processed by an RC type low-pass filter so as to eliminate the components of the carrier and extract therefrom on the one hand the envelope of the modulated signal, generally referred to as the reference modulating signal Vmod, and on the other its continuous component DC. A cutoff frequency of a few tens of kHz can be chosen for that first filter. The continuous level DC is then extracted by another low-pass filter whose cutoff frequency is less than the frequency of the modulating signal Vmod, e.g. a few kHz. The demodulation signal Vdemod can then be obtained by comparison between the modulating reference signal Vmod and its continuous level DC.

Such a demodulation device presents a number of limitations due to its very structure. Indeed, the continuous level DC varies greatly as a function of the position of the card in the field of the-reader, and of its displacement speed. This situation makes it difficult to generate a reliable comparison level on a permanent basis. This problem is even more acute in applications where a large range, about 50 cm to 1 m, is required.

Figure 3A:
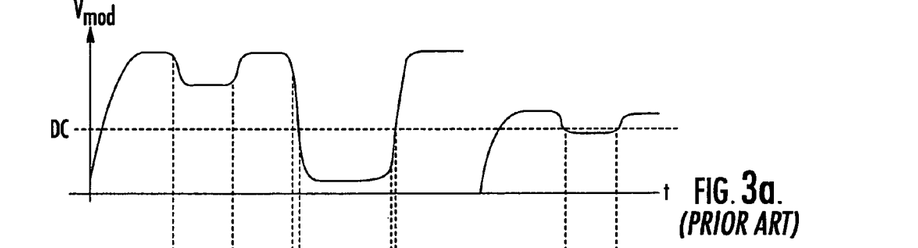
FIGS. 3a to 3c, already described, are graphs illustrating respectively the modulated signal and its dc level, the signal demodulated with a classical device and the demodulated signal with a demodulator according to the invention.
Figure 3B:
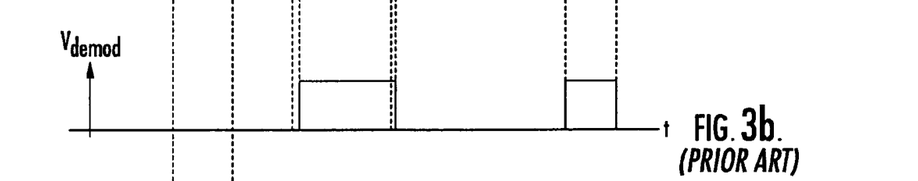
Figure 3C:
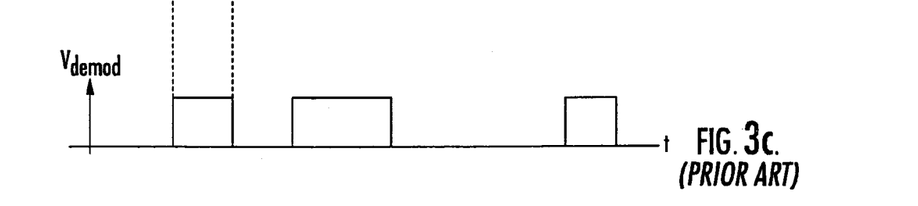

The graphs of FIGS. 3a to 3c illustrate the limits of classical demodulation devices.

The reference modulating signal Vmod is represented on FIG. 3a with its continuous level DC. The demodulation signal Vdemod is shown in FIG. 3b. It is observed that certain modulations can fail to be detected and that the modulations identified by the device are not perfectly identified, i.e. the start and end of modulation are not identified with precision.

FIG. 3c illustrates to this end the aim of the present invention, which consists in producing, for a contactless device, a demodulator capable of identifying with precision the start and end of all the modulated signals sent by the reader.

SUMMARY OF THE INVENTION

An object of the present invention is to overcome the drawbacks of the prior art, and to propose an active demodulator based on the "peak and trough detection" principle.

The demodulator according to the invention is termed "active", i.e. it is capable of generating, by following the dynamically modulated signal, a low (lower) threshold and a high (higher) threshold which allow to identify precisely the start and end of demodulation.

Such a demodulator is principally comprised of two independent demodulators that are respectively optimized to detect the start and end of the modulated signal.

The invention more particularly has for an object a demodulator for an amplitude modulated signal, characterised in that it comprises:

a peak detection cell for extracting the reference modulating signal from the modulated signal;

a first demodulator for detecting the peak of the reference modulating signal to generate an upper comparison threshold and identify the start of modulation;

a second demodulator for detecting a trough of the reference modulating signal to generate a lower comparison threshold and identify the end of modulation; and a logic processing unit for supplying the demodulated signal.

According to a characteristic, the peak detection cell comprises:

a diode to which is input the modulated signal, and a capacitor in parallel with a current source, the reference modulating signal representing the charging and discharging voltage at the terminals of the capacitor.

According to a characteristic, the peak detection cell further produces a shifted copy of the reference modulating voltage.

According to a characteristic, the first demodulator produces a shifted copy of the reference modulating signal and comprises a detection cell for detecting the peak of the shifted reference signal so as to generate an upper comparison threshold, a comparator being provided to detect the crossing between the upper threshold and the shifted reference signal to define the start of modulation.

According to a preferred embodiment, the peak detection cell of the first demodulator comprises at least one transistor which is conducting in the absence modulation and blocking during modulation, the transistor being connected in series with a capacitor in parallel with a current mirror, the start of modulation being identified by the discharge of the capacitor by the current mirror.

According to a specific aspect, the upper comparison threshold is generated by a shift of the discharge voltage at the terminals of a capacitor.

According to an embodiment, the slope of the discharge is comprised between 50 and 100 kV/s.

According to another characteristic, the second demodulator produces a shifted copy of the reference modulating signal and comprises a cell for detecting troughs of the shifted reference signal so as to generate the lower comparison threshold, a comparator being provided to detect the crossing between the lower threshold and the shifted reference signal to define the end of modulation.

According to a preferred embodiment, the trough detection cell of the second demodulator comprises at least one transistor which is blocking in the absence of modulation and conducting during modulation, the transistor being connected in parallel with a capacitor and in series with a current mirror, the end of modulation being identified by the recharge of the capacitor by the current mirror.

According to a specific aspect, the lower comparison threshold is generated by a shift of the charging voltage at the terminals of a capacitor.

According to an embodiment, the charging slope is comprised between 50 and 100 kV/s.

According to another characteristic, the logic processing unit comprises two latches controlled respectively by the comparators of the peak detection demodulator and the trough detection demodulator.

According to another characteristic, the demodulator further comprises a feedback control system for maintaining the reference modulating signal below the supply voltage of the demodulator.

The present invention also has for an object a contactless device, of the IC card type, comprising such a demodulator.

According to a characteristic, the device is capable of communicating with a read/write device over a distance that can reach 1 m with a displacement speed that can reach 3 m/s.

The demodulator according to the invention allows to frame very precisely the start and end of modulation. It is thus possible to be free from the constraints linked to large variations in dc levels of the modulated signals.

Accordingly, the demodulator according to the invention can be used in applications for which a large range and high displacement speed are required between the contactless device and the reader.

BRIEF DESCRIPTION OF THE DRAWINGS

Other characteristics and advantages of the present invention shall become apparent from the description that follows, given as an illustrative and non-limiting example with reference to the drawings in which.

DETAILED DESCRIPTION OF THE PREFERRED EMBODIMENTS

The description that follows makes reference to a contactless card receiving from the reader an amplitude modulated signal whose carrier frequency is 13.56 MHz and whose modulation index is 10%. The application requires an RF communication range capable of attaining 1 m for a card displacement speed in the field of the reader that can attain 3 m/s.

Figure 4:
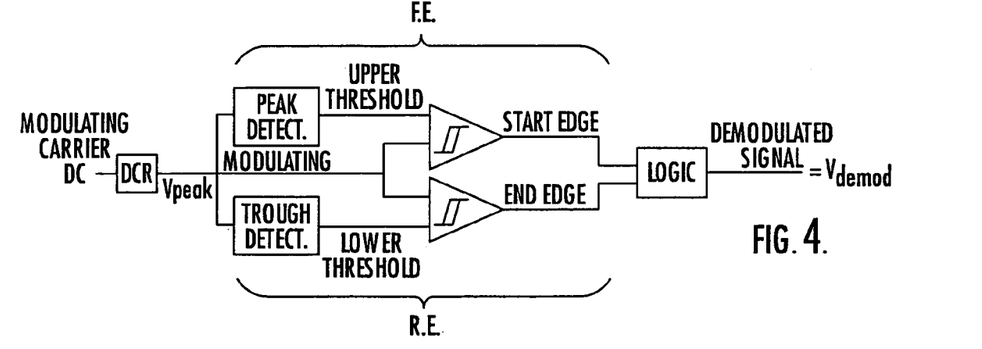
FIG. 4 is a functional diagram of the demodulator according to the invention.

Referring to FIG. 4, which is a block diagram of the demodulator according to the invention, the modulated signal Vdb is first of all processed by a "peak detection" cell DCR, which extracts the reference modulating signal Vpeak.

Two independent demodulators FE and RE arranged in parallel then detect respectively the start and end of the modulation, these intermediate results are then digitally processed by logic to produce the demodulated signal.

The first demodulator shall hereafter be designated "Falling Edge" FE, since it detects the upper threshold of the reference modulating signal Vpeak and identifies the start of the modulation upon a drop in voltage in Vpeak (drop produced by the 10% modulation in the example considered).

The second demodulator shall hereafter be designated "Rising Edge" RE, since is detects a trough in the reference modulating signal Vpeak (trough corresponding to the 10% modulation) to generate a lower threshold specific to that modulation and identify the end of the modulation upon the rising again of the voltage Vpeak.

There is thus obtained a dynamic demodulator that follows the evolution of the modulated signal to repeat in real time the start and end of the modulation.

The demodulator according to the invention comprises a number of electronic units for its implementation. These different blocks are illustrated by circuit diagrams in FIG. 7. This figure represents just one example of an implementation in a contactless card or electronic badge and must in no case be seen as restrictive.

The first implementation step consists in extracting a reference modulating signal (an envelope) from the modulated signal Vdb so as to eliminate the carrier from the latter.

Figure 5:
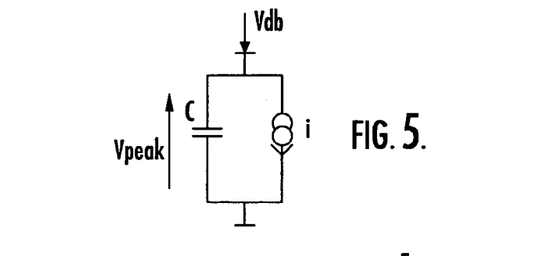
FIG. 5 is a functional diagram of a basic cell for the "peak" detection.

To this end, there is performed a first peak detection DCR from a basic cell shown schematically in FIG. 5. Such a cell is essentially composed of a diode, a capacitor and a direct current source, and enables to extract the reference modulating signal Vpeak from the modulated signal Vdb.

When dealing with a double alternating modulated signal Vdb, the capacitor C can only be charged during a positive cycle of Vdb, i.e. when Vdb−Vpeak>Vd, where Vd is the diode's threshold voltage. As soon as this relation no longer holds, the diode of the basic cell cuts off and the capacitor C has a memory effect, i.e. at the moment when the diode cuts off, there is very precisely Vpeak=vdb(peak)−Vd. Capacitor C is then discharged at constant current and Vpeak decreases according to the relation dVpeak/dt=−i/C.

It is consequently necessary to choose an appropriate time constant, of a few tens of kHz, for. example, to recover the modulated signal without attenuation, while limiting the resultant due to the carrier. Indeed, the frequency of the modulated signal is slow in comparison to that of the carrier.

Figure 6:
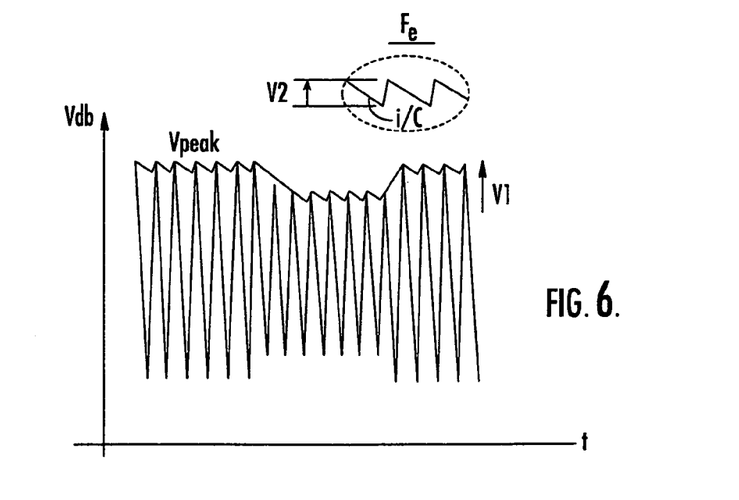
FIG. 6 is a graph illustrating the reference modulating signal of the modulated signal.

FIG. 6 is a graph illustrating the reference modulating signal Vpeak extracted from the modulated signal Vdb by the basic cell of FIG. 5.

If V1 is the modulation depth (10% for example) and V2 is the resultant of the carrier on the extracted signal Vpeak, V2 can be considered as the noise level on Vpeak. With a carrier frequency Fc, it is possible to estimate the value V2(max)=i/(C*Fc), which corresponds to the discharge of the capacitor over a complete period of the carrier.

Figure 7:
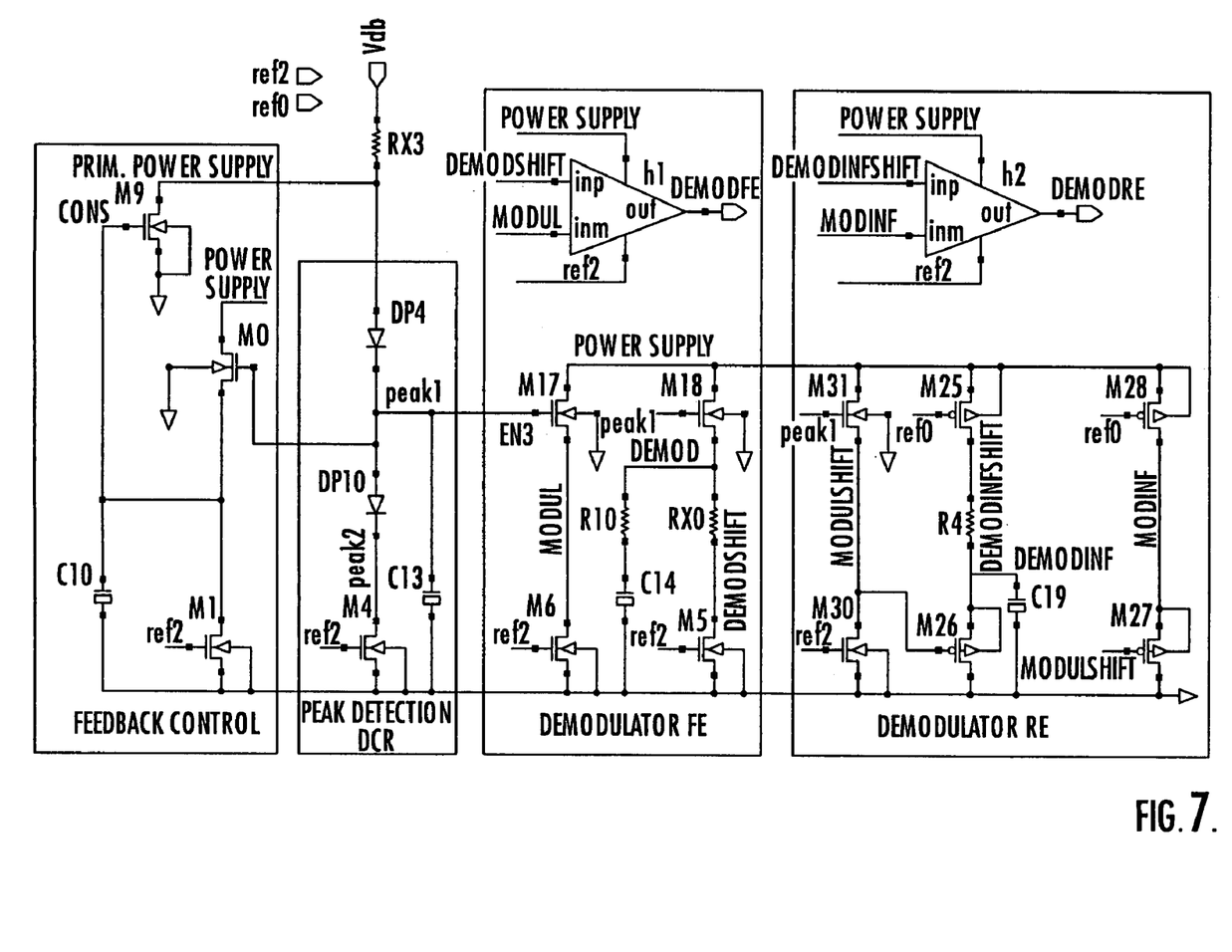
FIG. 7 is a block diagram of the implementation of the demodulator according to the invention in a contactless device.

In the implementation according to the example of FIG. 7, the reference modulating signal Vpeak1 is directly extracted from the modulated signal Vdb coming from the antenna. The parameters of the current mirror M4 and of the capacitor C13 are defined to obtain a discharge slope of Vpeak1 of 600 kV/a.

Further to different simulations produced with several contactless cards, it was possible to establish a maximum modulation of 500 mV in 1 μs, i.e. a slope of 500 kV/s, which is less than the discharge slope (600 kV/s) of the peak detection cell DCR of the demodulator in accordance with the invention.

The resultant of the carrier V2 can be estimated at 44 mV for a carrier frequency of 13.56 MHz. The noise level is thus acceptable for a modulation depth of 500 mV.

An image Vpeak2 of the reference modulating signal Vpeak1 is produced by means of a simple shift using a diode. It is these two signals Vpeak1 and Vpeak2 that shall be used subsequently respectively by demodulators FE and RE, whose results shall be processed by a logic unit which is not shown in FIG. 7.

Note that the demodulator according to the invention is furthermore provided with a feedback control system which allows to set the reference modulating signal Vpeak1 to the highest possible point of dynamic admissible for the demodulator, irrespective of its power supply, which can be comprised between 2V and 5V, for example. A high voltage transistor M9. draws through a resistor RX3 a current which is variable as a function of the modulated signal level Vdb. There is thus obtained a variable shift between Vdb and the power supply.

Figure 8:
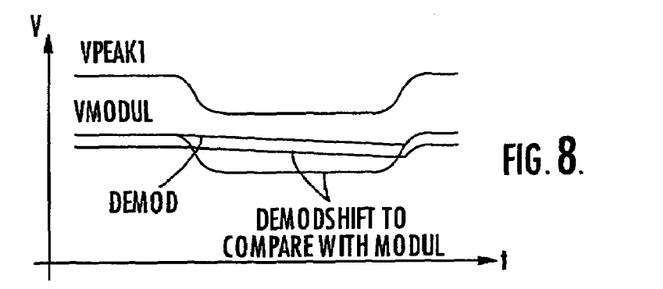
FIG. 8 is a schematic illustration of the detection of the start of modulation by the demodulator according to the invention.

Reference shall now be made to FIGS. 7 and 8, which illustrate the operation of the demodulator FE that identifies the start of modulation.

This demodulator FE is also based on the peak detection principle, but the diode is replaced by an NMOS transistor in a follower configuration. As illustrated in FIG. 7, the transistors M17 and M18 are transistors connected as followers and biased by current mirrors M5 and M6.

Transistor M17 produces a copy of the reference modulating signal Vpeak1 at Vmodul with a shift of Vt corresponding to the threshold voltage of transistor M17, e.g. of 0.7V.

Transistor M18 acts like the diode of the peak detection basic cell DCR to create an upper threshold Vdcmod on signal Vmodul. Vdcmod represents the voltage across the terminals of capacitor C14.

In the absence of modulation, M18 charges capacitor C14 and there is then Vdcmod=Vmodul (Vdcmod is on the peak of the modulated signal). When the amplitude modulation starts, the voltage Vpeak1 drops and there is then Vpeak1−Vt<Vmodul. Transistor M28 switches off and capacitor C14 is discharged at constant current by the current mirror M5 which biases transistor M18. Vdcmod then represents the discharge of capacitor C14 at constant current. The discharge slope of Vdcmod is fixed at 75 kV/s.

This discharge is slow relative to the modulation, but should however be faster than a possible drop in the power supply when the card moves away from the reader. Considering a card having a range of 50 cm moving at 3 m/s relative to the reader, and considering to a first approximation that the internal supply voltage is proportional to the communication distance between the label and the reader, there can be a variation of 2V to 4V over 50 cm in ⅙ s, which gives a minimum discharge slope of 12 V/s, to compare with 75 kV/s.

Vdcmod identifies the peak of signal Vmodul. To create a comparison threshold, Vdcmod is reproduced at Vdcmodshift using a potential drop across a resistor RX0 through which passes the biasing current. There can thus be obtained a shift of around 110 mV before hysteresis between Vdcmod and Vdcmodshift.

The start of modulation is determined by the crossing of Vmodul with Vdcmodshift. These two signals are processed by a comparator exhibiting a hysteresis of 50 mV, sufficient to eliminate possible multiple transitions due to the resultant of the carrier. The threshold for triggering the detection of the start of modulation is thus of around 160 mV, which is relatively precise if there is a modulation depth of 500 mV, and cannot be confused with a resultant of the carrier estimated at 44 mV.

Figure 9:
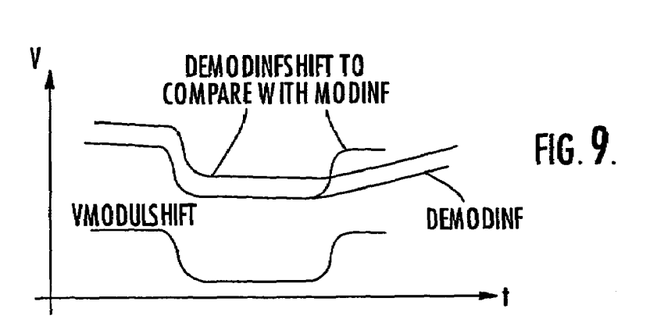
FIG. 9 is a schematic illustration of the detection of the end of modulation by the demodulator according to the invention.

Likewise, the detection of end of modulation by demodulator RE is illustrated in its principle in FIG. 9.

While demodulator FE tracks the peak of the modulated signal in order to generate a threshold lower than the latter and to identify the start of modulation, demodulator RE tracks the troughs of the modulated signal (during which there is modulation) in order to generate a threshold higher than the latter and identify the end of modulation.

To this effect, it is necessary to be able to discharge a capacitor quickly in order to memorise the level of the trough, and then to recharge that capacitor at constant current to create a recharging slope that can generate a comparison threshold.

This is achieved by NMOS transistor M31 and PMOS transistors M26 and M27 in a follower configuration and biased by current mirrors M30, M25 and M28. Transistor M31 copies Vpeak2 at Vmodulshift, and transistor M27 copies Vmodulshift at Vmodinf with a shift Vtp equal to approximately 1V.

The object of this double copying is to re-center signal Vmodinf, which shall be used for the comparisons, within the dynamic of the system. Indeed, the feedback control maintains Vpeak1 approximately at the level of the power supply. Vmodulshift is the shifted copy of Vpeak2, i.e. the image of Vpeak1 shifted by a diode threshold plus an NMOS transistor threshold, that is a shift of 1.4V. Now, given that the detection in demodulator RE is carried out by PMOS transistors, it is necessary to raise the levels of the signals, which is why one works with Vmodinf which corresponds approximately to Vpeak1−0.4V, and which then remains in the input dynamic of the comparator of demodulator RE.

The lower threshold at the trough of signal Vmodinf shall be represented by the voltage at the terminals of capacitor C19, Vdcmodinf.

In the absence of modulation, capacitor C19 is charged. When modulation occurs, Vmodulshift drops and becomes lower than Vdcmodinf−Vtp. Transistor M26 becomes conducting and rapidly discharges C19 so long as Vdcmodinf does not return to the level of Vmodulshift+Vtp, that is Vdcmodinf=Vmodinf. There is thus indeed Vdcmodinf in the trough of the image of the modulated signal Vmodinf.

When the modulation ceases, Vmodulshift rises again and switches off transistor M26, which no longer draws current on capacitor C19. The latter can then be recharged at constant current by current mirror M25. The time constant of demodulator RE is chosen to be identical to that of demodulator FE, that is 75 kV/s in the example considered.

Signal Vdcmodinf identifies the trough of the signal Vmodinf. As before, to create a comparison threshold, Vdcmodinf is copied on Vdcmodinfshift by a drop in potential across a resistor RX4 through which passes the biasing current. There can thus be obtained a shift of approximately 75 mV before hysteresis between Vdcmodinf and Vdcmodinfshift.

End of modulation is determined by the crossing of Vmodinf with Vdcmodinfshift. These two signals are processed by the same comparator as the one used for demodulator FE, exhibiting a hysteresis of 50 mV. The triggering threshold for the detection of the end of modulation is thus approximately 125 mV.

Figure 11:
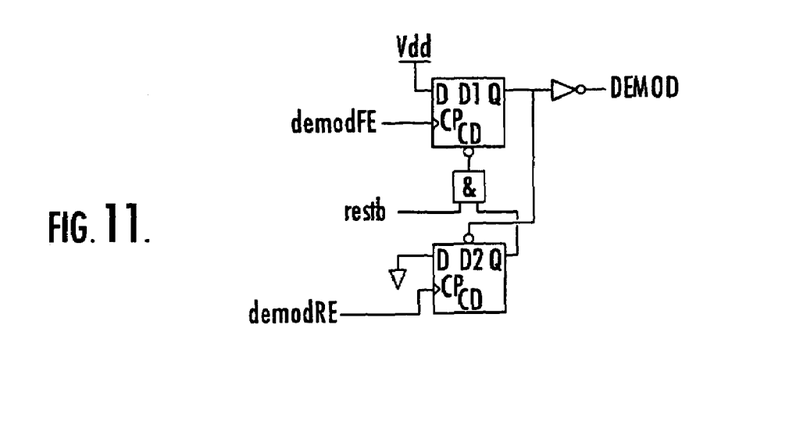
FIG. 11 is a diagram of the logic unit of the demodulator according to the invention.

The signal demodulated by the demodulator according to the invention corresponds to the logic processing of the outputs of the two comparators of the two demodulators FE and RE, as shown in FIG. 11.

Figure 10:
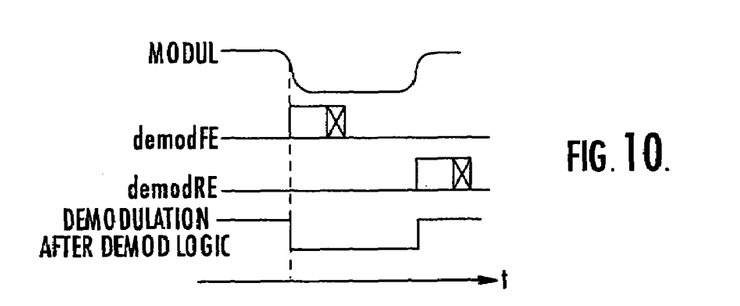
FIG. 10 illustrates graphically the signal demodulated by the demodulator according to the invention.

FIG. 10 illustrates graphically the output signals of the comparators. An image of the modulated signal is given by the graph "modul", the output of the comparator of demodulator FE is represented by the graph "demodFE" which identifies precisely the start of modulation, and the output of the comparator of demodulator RE is represented by the graph "demodRE" which identifies precisely the end of modulation. The demodulated signal is represented at the last graph.

The logic of the demodulator in accordance with the invention is designed to detect the first crossing between the modulated signal and the comparison thresholds, the second crossing representing no useful information in the application considered.

As illustrated in FIG. 11, the first crossing detected by comparator FE activates a first latch D1 which thus announces the start of modulation, and the first crossing detected by comparator RE activates a second latch. D2 which thus announces the end of modulation.

Figure 12A:
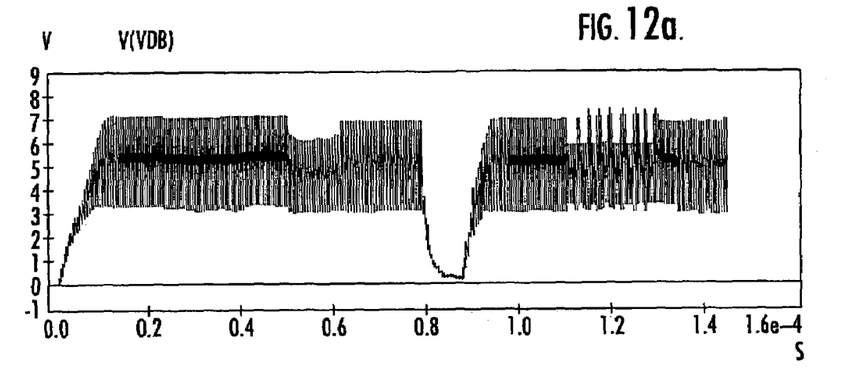
FIGS. 12a to 12c are graphs illustrating respectively the modulated signal, the reference modulating signal and the signal demodulated by the demodulator according to the invention.
Figure 12B:
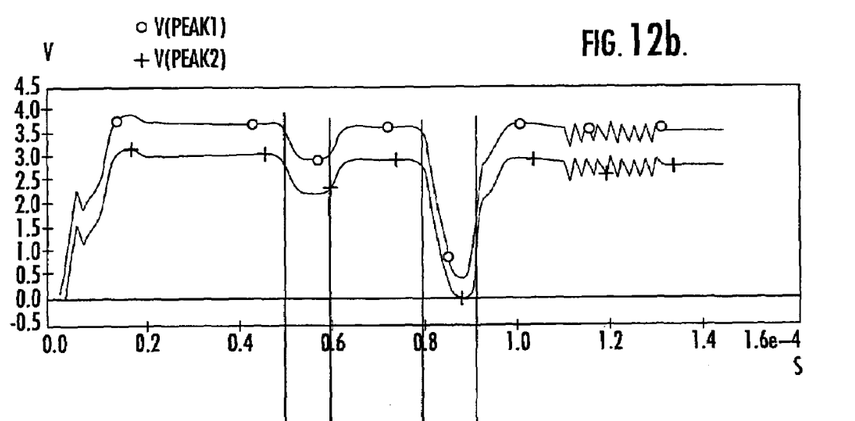
Figure 12C:
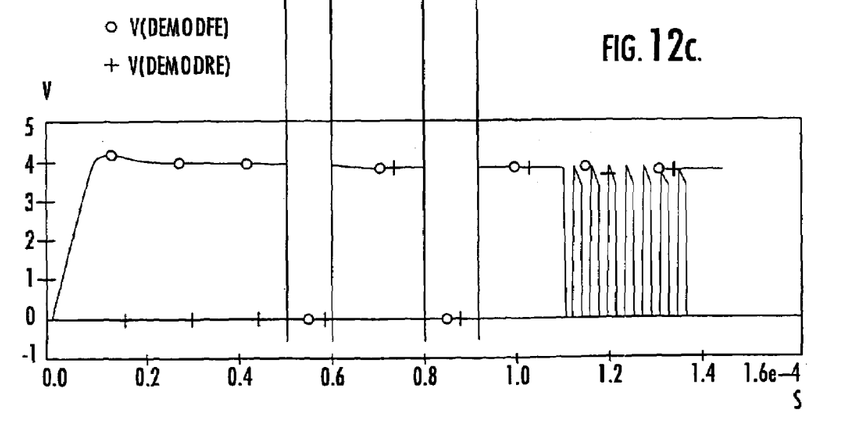

FIGS. 12a to 12c are graphs illustrating simulations of the demodulation of a signal Vdb with a demodulator in accordance with the invention. Graph 12c illustrates well the fine degree of precision of the demodulation.

The invention claimed is:

1. A demodulator for an amplitude modulated signal comprising:
    a peak detection cell (DCR) for extracting a reference modulating signal from the amplitude modulated signal;
    a first demodulator for detecting a peak of the reference modulating signal to generate an upper comparison threshold and identify a start of modulation;
    a second demodulator for detecting a trough of the reference modulating signal to generate a lower comparison threshold and identify an end of modulation; and
    a logic processing unit connected to said first and second demodulators for supplying a demodulated signal.

2. A demodulator according to claim 1 wherein said peak detection cell (DCR) comprises:
    a diode receiving the amplitude modulated signal;
    a current source connected to said diode; and
    a capacitor having terminals in parallel with said current source so that the reference modulating signal represents a charging and discharging voltage at the terminals of said capacitor.

3. A demodulator according to claim 1 wherein said peak detection cell (DCR) further produces a shifted copy of the reference modulating signal.

4. A demodulator according to claim 1 wherein said first demodulator produces a first shifted copy of the reference modulating signal and comprises:
    a peak detection cell for detecting peaks of the first shifted copy of the reference modulating signal to generate the upper comparison threshold; and
    a first comparator to detect a crossing between the upper comparison threshold and the first shifted copy of the reference modulating signal to define the start of modulation.

5. A demodulator according to claim 4 wherein said peak detection cell comprises:
    a first capacitor;
    a first current mirror connected in parallel with said first capacitor; and
    at least one first transistor connected in series with said first capacitor and conducting in an absence modulation and blocking during modulation so that the start of modulation is identified by a discharge of said first capacitor by said first current mirror.

6. A demodulator according to claim 5 wherein the upper comparison threshold is generated by a shift of the discharge of said first capacitor.

7. A demodulator according to claim 6 wherein the discharge has a slope between 50 and 100 kV/s.

8. A demodulator according to claim 1 wherein said second demodulator produces a second shifted copy of the reference modulating signal and comprises:
   a trough detecting cell for detecting troughs of the second shifted copy of the reference modulating signal to generate the lower comparison threshold; and
   a second comparator to detect a crossing between the lower comparison threshold and the second shifted copy of the reference modulating signal to define the end of modulation.

9. A demodulator according to claim 8 wherein said trough detection cell comprises:
   a second capacitor;
   a second current mirror connected in series with said second capacitor; and
   at least one second transistor connected in parallel with said second capacitor and blocking in an absence modulation and conducting during modulation so that the end of modulation is identified by a recharge of said second capacitor by said second current mirror.

10. A demodulator according to claim 9 wherein the lower comparison threshold is generated by a shift of the recharge of said second capacitor.

11. A demodulator according to claim 10 wherein the recharge has a slope between 50 and 100 kV/s.

12. A demodulator according to claim 1 wherein said first demodulator comprises a peak detection cell and a first comparator connected thereto; wherein said second demodulator comprises a trough detection cell and a second comparator connected thereto; and wherein said logic processing unit comprises first and second latches controlled respectively by said first and second comparators.

13. A demodulator according to claim 1 further comprising a feedback control system for maintaining the reference modulating signal below a supply voltage.

14. A demodulator for an amplitude modulated signal comprising:
   a peak detection cell (DCR) for extracting a reference modulating signal from the amplitude modulated signal;
   a first demodulator comprising
   a peak detection cell for detecting peaks of a first shifted copy of the reference modulating signal to generate an upper comparison threshold, and
      a first comparator to detect a crossing between the upper comparison threshold and the first shifted copy of the reference modulating signal to define a start of modulation;
   a second demodulator comprising
      a trough detecting cell for detecting troughs of a second shifted copy of the reference modulating signal to generate a lower comparison threshold, and
      a second comparator to detect a crossing between the lower comparison threshold and the second shifted copy of the reference modulating signal to define an end of modulation; and
   a logic processing unit connected to said first and second demodulators for supplying a demodulated signal.

15. A demodulator according to claim 14 wherein said peak detection cell (DCR) comprises:
   a diode receiving the amplitude modulated signal;
   a current source connected to said diode; and
   a capacitor having terminals in parallel with said current source so that the reference modulating signal represents a charging and discharging voltage at the terminals of said capacitor.

16. A demodulator according to claim 14 wherein said peak detection cell comprises:
   a first capacitor;
   a first current mirror connected in parallel with said first capacitor; and
   at least one first transistor connected in series with said first capacitor and conducting in an absence modulation and blocking during modulation so that the start of modulation is identified by a discharge of said first capacitor by said first current mirror.

17. A demodulator according to claim 14 wherein said trough detection cell comprises:
   a second capacitor;
   a second current mirror connected in series with said second capacitor; and
   at least one second transistor connected in parallel with said second capacitor and blocking in an absence modulation and conducting during modulation so that the end of modulation is identified by a recharge of said second capacitor by said second current mirror.

18. A demodulator according to claim 14 wherein said logic processing unit comprises first and second latches controlled respectively by said first and second comparators.

19. A demodulator according to claim 14 further comprising a feedback control system for maintaining the reference modulating signal below a supply voltage.

20. A contactless device comprising:
   a peak detection cell (DCR) for extracting a reference modulating signal from an amplitude modulated signal;
   a first demodulator for detecting a peak of the reference modulating signal to generate an upper comparison threshold and identify a start of modulation;
   a second demodulator for detecting a trough of the reference modulating signal to generate a lower comparison threshold and identify an end of modulation; and
   a logic processing unit connected to said first and second demodulators for supplying a demodulated signal.

21. A contactless device according to claim 20 wherein said peak detection cell (DCR) comprises:
   a diode receiving the amplitude modulated signal;
   a current source connected to said diode; and
   a capacitor having terminals in parallel with said current source so that the reference modulating signal represents a charging and discharging voltage at the terminals of said capacitor.

22. A contactless device according to claim 20 wherein said peak detection cell (DCR) further produces a shifted copy of the reference modulating signal.

23. A contactless device according to claim 20 wherein said first demodulator produces a first shifted copy of the reference modulating signal and comprises:
   a peak detection cell for detecting peaks of the first shifted copy of the reference modulating signal to generate the upper comparison threshold; and
   a first comparator to detect a crossing between the upper comparison threshold and the first shifted copy of the reference modulating signal to define the start of modulation.

24. A contactless device according to claim 23 wherein said peak detection cell comprises:
  a first capacitor;
  a first current mirror connected in parallel with said first capacitor; and
  at least one first transistor connected in series with said first capacitor and conducting in an absence modulation and blocking during modulation so that the start of modulation is identified by a discharge of said first capacitor by said first current mirror.

25. A contactless device according to claim 20 wherein said second demodulator produces a second shifted copy of the reference modulating signal and comprises:
  a trough detecting cell for detecting troughs of the second shifted copy of the reference modulating signal to generate the lower comparison threshold; and
  a second comparator to detect a crossing between the lower comparison threshold and the second shifted copy of the reference modulating signal to define the end of modulation.

26. A contactless device according to claim 25 wherein said trough detection cell comprises:
  a second capacitor;
  a second current mirror connected in series with said second capacitor; and
  at least one second transistor connected in parallel with said second capacitor and blocking in an absence modulation and conducting during modulation so that the end of modulation is identified by a recharge of said second capacitor by said second current mirror.

27. A contactless device according to claim 20 wherein said first demodulator comprises a peak detection cell and a first comparator connected thereto; wherein said second demodulator comprises a trough detection cell and a second comparator connected thereto; and wherein said logic processing unit comprises first and second latches controlled respectively by said first and second comparators.

28. A contactless device according to claim 20 further comprising a feedback control system for maintaining the reference modulating signal below a supply voltage.

29. A contactless device according to claim 20 capable of communicating with a read/write device over a distance of up to 1 m and with a displacement speed of up to 3 m/s.

30. A demodulation method comprising:
  extracting a reference modulating signal from an amplitude modulated signal;
  detecting a peak of the reference modulating signal to generate an upper comparison threshold and identify a start of modulation;
  detecting a trough of the reference modulating signal to generate a lower comparison threshold and identify an end of modulation; and
  performing logic processing for supplying a demodulated signal based upon the extracting and detecting.

31. A method according to claim 30 wherein detecting a peak comprises:
  generating a first shifted copy of the reference modulating signal;
  detecting peaks of a first shifted copy of the reference modulating signal to generate the upper comparison threshold; and
  detecting a crossing between the upper comparison threshold and the first shifted copy of the reference modulating signal to define the start of modulation.

32. A method according to claim 30 wherein detecting a trough comprises:
  generating a second shifted copy of the reference modulating signal;
  detecting troughs of the second shifted copy of the reference modulating signal to generate the lower comparison threshold; and
  detecting a crossing between the lower comparison threshold and the second shifted copy of the reference modulating signal to define the end of modulation.

33. A method according to claim 30 further comprising maintaining the reference modulating signal below a supply voltage.

* * * * *

UNITED STATES PATENT AND TRADEMARK OFFICE
CERTIFICATE OF CORRECTION

PATENT NO. : 7,215,723 B2 Page 1 of 1
APPLICATION NO. : 10/239291
DATED : May 8, 2007
INVENTOR(S) : Rizzo et al.

It is certified that error appears in the above-identified patent and that said Letters Patent is hereby corrected as shown below:

Column 8, Line 27    Delete: "(DCR)"

Column 8, Line 40    Delete: "(DCR)"

Column 8, Line 48    Delete: "(DCR)"

Column 10, Line 2    Delete: "(DCR)"

Column 10, Line 36   Delete: "(DCR)"

Column 10, Line 48   Delete: "(DCR)"

Column 10, Line 56   Delete: "(DCR)"

Signed and Sealed this

Ninth Day of June, 2009

JOHN DOLL
*Acting Director of the United States Patent and Trademark Office*